DEMODULATOR USING THE MONOSTABLE CHARACTERISTIC OF A NEGATIVE RESISTANCE DIODE
Filed Nov. 15, 1960 2 Sheets-Sheet 1
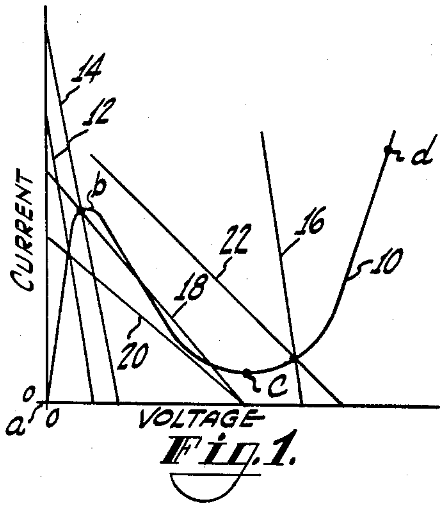
Fig. 1.
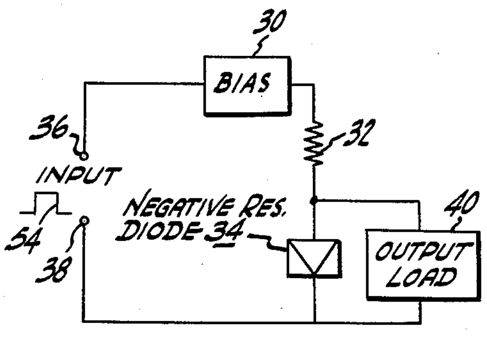
Fig. 2.
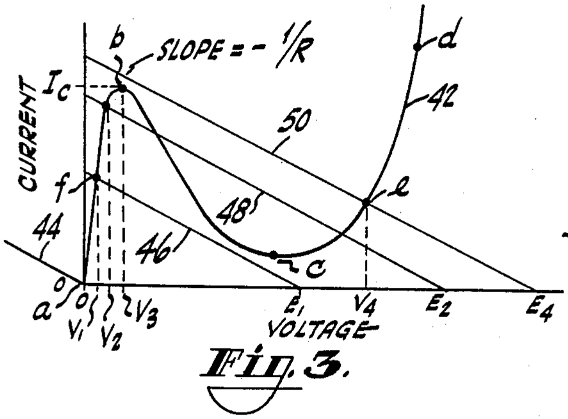
Fig. 3.
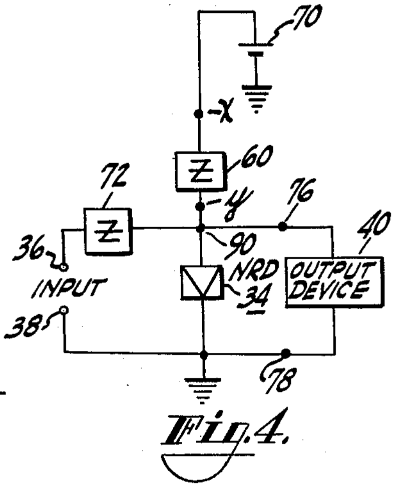
Fig. 4.
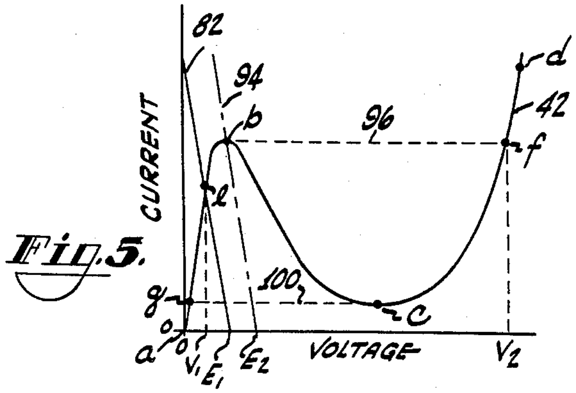
INVENTOR.
GERALD B. HERZOG
BY John V. Regan
ATTORNEY Oct. 22, 1963 G. B. HERZOG 3,108,229

DEMODULATOR USING THE MONOSTABLE CHARACTERISTIC OF A NEGATIVE RESISTANCE DIODE

Filed Nov. 15, 1960 2 Sheets-Sheet 2

INVENTOR.
GERALD B. HERZOG
BY John V. Regan
ATTORNEY

United States Patent Office 3,108,229

Patented Oct. 22, 1963

3,108,229

DEMODULATOR USING THE MONOSTABLE CHARACTERISTIC OF A NEGATIVE RESISTANCE DIODE

Gerald Bernard Herzog, Princeton, N.J., assignor to Radio Corporation of America, a corporation of Delaware Filed Nov. 15, 1960, Ser. No. 69,398
6 Claims. (Cl. 329—105)

This invention relates to monostable circuits and, more particularly, although not exclusively, to discriminators, demodulators and the like which employ negative resistance diodes biased for monostable operation.

A monostable circuit may be defined as one having only one stable operating state. That is to say, the quiescent load line has only one stable operating point of intersection with the operating characteristic of the active element. The circuit may be triggered to a quasi-stable state in response to an input signal, but the circuit always returns to the one stable state at the end of an operating cycle.

It has been found that certain types of negative resistance diodes, tunnel diodes for example, are especially well suited for use as the active elements in monostable circuits. These diodes have high switching speed capabilities and low power requirements, and can provide gain. In particular, negative resistance diode monostable circuits may provide amplitude discrimination and pulse demodulation in baseband and pulsed carrier type systems. Also, gain may be realized in these operations under certain conditions.

It is an object of the present invention to provide improved monostable circuits which employ negative resistance diodes.

It is another object of the present invention to provide novel diode discriminators and pulsed carrier demodulators.

It is still another object of the invention to provide novel discriminators and demodulators for use in baseband and pulsed carrier systems.

It is yet another object of the invention to provide novel diode demodulators and discriminators which furnish gain in the operating process.

These and other objects of the invention are accomplished by the combination of: a negative resistance diode; means quiescently biasing said diode monostably; and means for applying input signals to said diode. The biasing means may be adjusted to provide a suitable threshold to input signals.

In the accompanying drawing, like reference characters refer to like components, and:

FIGURE 1 is a static volt-ampere characteristic of a typical tunnel diode, and several monostable load lines;

FIGURE 2 is a diagram of a monostable circuit according to the invention, which circuit may perform amplitude discrimination of applied input signals;

FIGURE 3 is a volt-ampere characteristic useful in explaining the operation of the FIGURE 2 circuit;

FIGURE 4 is a diagram of another monostable circuit which can perform amplitude discrimination;

FIGURE 5 is a volt-ampere characteristic useful in explaining the operation of the FIGURE 4 circuit;

Figure 6:
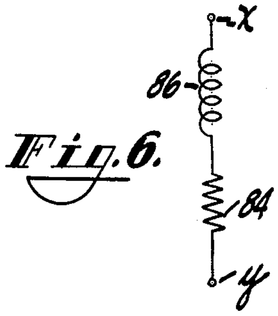
FIGURE 6 is a schematic drawing of a suitable impedance device for use in the biasing circuit of the FIGURE 4 circuit.

Tunnel diodes are preferred as the active elements in practicing the invention because of their inherent high speed switching capabilities and low power requirements. Tunnel diodes, and the characteristics thereof, are described, for example, in an article by H. S. Sommers, Jr. in the Proceedings of the IRE, July 1959, at page 1201, and in other publications. Only those properties of a tunnel diode necessary for an understanding of the invention will be described here.

A tunnel diode is a voltage-controlled negative resistance device, and its static volt-ampere characteristic is sometimes referred to as an N-shaped characteristic because its shape is somewhat similar generally to the letter N. A static characteristic curve 10 of current versus voltage for a typical tunnel diode is illustrated in FIGURE 1. In FIGURE 1, voltage is plotted along the abscissa and current is plotted along the ordinate. The portions *ab* and *cd* of the curve 10 are regions of positive resistance, that is to say, the quantity $dV/dI$ has a positive value in these regions. The region *bc* is a region of negative resistance, wherein the quantity $dV/dI$ has a negative value. A tunnel diode has a tendency to oscillate when it is biased in the negative resistance region *bc* of its operating characteristic 10.

Monostable operation of a tunnel diode is achieved by a proper selection of the power supply and load parameters such that the quiescent load line (load line for no-signal condition) intersects the characteristic 10 in only one of the regions *ab* or *cd* of positive resistance. If the total resistance looking into the diode terminals, with the diode removed, has a value less than the average absolute value of the negative resistance of the diode (region *bc*), then only one intersection of the load line with a positive resistance region of the curve 10 is possible. The load lines 12, 14, 16 and 18 are illustrative of this condition for different values of bias. On the other hand, the circuit may operate monostably with a total resistive load component having a value greater than the average absolute value of the negative resistance (region *bc*). The load lines 20 and 22 illustrate this condition for different bias values. It is necessary, in the latter cases, to adjust the bias so that the no-signal load lines 20 and 22 have only one point of intersection in a region *ab* or *cd* of positive resistance. This condition must be met for all possible conditions of output load connected to the circuit.

Consider now the circuit illustrated schematically in FIGURE 2. A bias source 30, an impedance element 32 (illustrated as a resistor) and a negative resistance diode 34 are connected in series, in the order named, between first and second input terminals 36 and 38, respectively. The diode 34 preferably is a tunnel diode for reasons aforementioned, and will be assumed as such for purposes of discussion hereinafter. An output load 40 is connected in parallel with the tunnel diode 34 and may be, for example, another tunnel diode circuit or any other suitable output means. The bias source 30, which may be a battery (not shown) is not an essential element in the FIGURE 2 circuit, but may be included in order to provide a particular threshold, as will be described hereinafter. The tunnel diode 34 is connected so as to be biased in the forward direction by the bias source 30.

FIGURE 3 is a volt-ampere characteristic useful in explaining the operation of the FIGURE 2 circuit. The curve 42 is the static operating characteristic of the diode 34. The straight lines 44 . . . 50 are load lines for different values of voltage, and each has a slope $-1/R$, where R is the total external resistance seen by the diode 34. The value R includes the resistances of the load 40, the resistor 32, and the input circuitry (not shown) connected across the input terminals 36, 38. The value R is greater than the absolute value of the average negative resistance in the region *bc* of the characteristic 42. Consequently, a load line, such as the line 48, may intersect the curve 42 in both positive resistance regions *ab* and *cd* under certain voltage conditions. For monostable operation of the circuit, this condition is to be avoided in the quiescent state of no-signal input.

The FIGURE 2 circuit may operate as an amplitude discriminator to reject, or compress, input pulses having amplitudes less than a predetermined value and to pass with much less attenuation input signals having amplitudes greater than said predetermined value. An amplitude discriminator in this sense may be thought of as a threshold gate or device. The threshold may be set by adjusting the value of the bias source 30. As mentioned hereinabove, however, the quiescent load line may not intersect the curve 42 in more than one of the positive resistance regions.

Assume that the bias source 30 is absent from the FIGURE 2 circuit. The circuit of FIGURE 2 then has a quiescent load line 44 which includes the coordinates (O, O). The voltage across the diode (and the load 40) then is zero volts in the absence of an input signal. The D.C. load line translates in an upward direction in response to a positive input pulse 54 applied at the input terminals 36, 38, the amount of translation being a function of the amplitude of the input pulse 54. The lines 46, 48, 50 represent D.C. load lines for conditions of positive input signals having voltage amplitudes $E_1$, $E_2$ and $E_4$, respectively.

The voltage across the diode 34 (and load 40) for any input condition is given by the point of intersection of the curve 42 and the load line for that input condition. When the amplitude of the input is $E_1$ volts, for example, the voltage across the diode 34 is $V_1$ volts, which may be approximately 15 millivolts, depending upon the particular diode 34. The value $E_1$ may be approximately 325 millivolts. It is thus seen that the input signal is greatly attenuated, voltagewise. An input signal having an amplitude of $E_2$ volts, or approximately 600 millivolts, provides an output of $V_2$ volts, or approximately 30 millivolts.

If, however, the amplitude of the input signal 34 is increased to such a value that the corresponding load line intersects only the portion *cd* of the curve 42, a large output voltage, relatively speaking, is obtained. Stated in another way, a large output is obtained if the load line translates upwards beyond the peak *b* of the curve 42 such that the operating point jumps from the region *ab* to the region *cd*.

Consider the response of the circuit to an input pulse having a magnitude $E_4$ volts, for example, approximately 700 millivolts. The current through the diode 34, and the voltage thereacross, follows the curve 42 from *a* to *b*. When the diode current exceeds a value $I_c$, corresponding to point *b*, the diode 34 switches rapidly through the negative resistance region, assuming that the circuit reactance is negligibly small, the operating point jumping rapidly from point *b* to the point *e* of intersection of the load line 50 with the curve 42. The voltage across the diode 34, and the load 40, then has a value $V_4$ volts, or approximately 450 millivolts. When the input pulse 54 terminates, the diode 34 switches back rapidly through the negative resistance region, and the diode voltage rapidly returns to zero volts.

Operation of the FIGURE 2 circuit with zero volts quiescent bias may be summarized as follows. Positive input signals having an amplitude less than approximately 675 millivolts are greatly compressed or attenuated, and the output voltage then lies within the range of zero to $V_3$ volts, or zero to approximately 50 millivolts, the exact value depending upon the particular input amplitude and diode characteristic. Negative input signals, of course, also are greatly attenuated. On the other hand, positive input signals having an amplitude greater than approximately 675 millivolts pass to the output with much less attenuation and the voltage across the diode 34 may rise to a value within the range of approximately 450 to 550 millivolts, the exact value depending upon the amount by which the amplitude of the input signal exceeds the threshold of approximately 675 millivolts. It is to be noted that, for the quiescent bias conditions given, the output voltage is always less than the amplitude of the input signal. Also, the increment of energy delivered to the load is always less than that supplied by the input signal.

The aforementioned threshold may be adjusted to a different value by connecting a bias source 30 in the circuit. The bias (and threshold) may not be set indiscriminately, however, and must be selected such that the quiescent load line does not intersect the curve 42 in both regions of positive resistance. This limitation may be removed if the bias source 30 is a pulse source providing automatic reset, or if a reset pulse is applied to the circuit. The circuit then, however, is not truly a monostable circuit.

The aforementioned limitation on the threshold and quiescent bias also is removed if the total resistance in the circuit has a value less, for example, than the absolute value of the minimum negative resistance of the diode 34 in the negative resistance region *bc*. The parameters of voltage and resistance may be selected to provide, in the quiescent condition, a load line such as one of the load lines 12, 14, or 16 of FIGURE 1. It is to be understood that such a method of biasing is within the scope of the invention.

The FIGURE 2 circuit also may be quiescently biased to discriminate against, or compress, all negative signals having amplitudes less than a predetermined threshold, and to pass negative signals having amplitudes greater than said threshold. By way of illustration, assume that the bias supplied by the source 30 has a value $+E_4$ volts, or approximately 700 millivolts. The quiescent load line is then the line 50 of FIGURE 2. The diode 34 operates along the portion *ec* of the curve 42 in response to negative input signals having amplitudes insufficient to push the load line below the point *c*. That is, signals having amplitudes insufficient to decrease the diode 34 current below a value corresponding to point *c* in the valley of the curve 42. These input signals are compressed. If the load line moves downwards below point *c* in the valley of the curve 42, the diode 34 switches rapidly through the negative resistance region, and the voltage across the diode 34 falls to a low value as the operating point moves momentarily to the region *ab* of the curve 42.

Consider the circuit's response to a negative input signal having an absolute amplitude $E_4-E_1$ volts. The voltage across the diode 34 decreases from 450 millivolts to approximately 300 millivolts as the diode current decreases from a value corresponding to point *e* to a value corresponding to point *c*. The diode switches rapidly through the negative resistance region when the current is decreased below the latter value, and the operating state changes rapidly to the point *f* of intersection of the load line 46 with the region *ab* of curve 42. The voltage across the diode 34 and load 40 then is $V_1$ volts, or approximately 15 millivolts. Operation returns to point *e* upon termination of the negative input pulse, or returns automatically if the input pulse already has terminated.

The range of voltages across the load 40 for compressed or attenuated negative input signals is approximately 150 millivolts as compared to the range of approximately 50 millivolts for compressed positive input signals given in the previous example. This difference is due to the difference in slopes of the curve 42 in the regions *ab* and *ce*. Better results in compressing negative signals less than a certain amplitude may be obtained in the FIGURE 2 circuit by reversing the connections to the diode 40 and reversing the polarity of the fixed bias.

FIGURE 4 is a diagram of another monostable circuit according to the invention. The circuit comprises the series combination of a tunnel diode 34, an impedance device 60 and a bias supply, illustrated as a battery 70. The negative terminal of the battery 70 is connected to a point of reference potential, indicated by the conventional symbol for circuit ground. The tunnel diode 34 is connected in the forward direction, with respect to the battery 70, by connecting the cathode of the diode 34 to the reference potential, or ground. Input signals are applied across a pair of input terminals 36, 38. The terminal 36 is connected to the anode of the diode 34 through an impedance element 72. The terminal 38 is grounded. An output device 40 is connected across a pair of output terminals 76, 78 with terminal 76 connected to the anode of the diode 34, and the terminal 78 grounded.

The static volt-ampere characteristic 42 of the diode 34 is illustrated in FIGURE 5. For monostable operation, the value of the battery 70 is chosen such that the quiescent load line has only one intersection with a region of positive resistance *ab* or *cd*. The quiescent load line may be the solid line 82 in FIGURE 5. Of course, the circuit parameters may be chosen to provide any other suitable load line, such as one of the load lines illustrated in FIGURE 1. The slope of the line 82 indicates that the total circuit resistance looking across the diode 34 terminals, with the diode 34 removed, is less than the absolute value of the negative resistance of the diode 34. Under these conditions, no load line having the slope of the line 82 can ever intersect the curve 42 in both positive resistance regions, and the quiescent bias, therefore, could be set to provide any desired threshold.

The FIGURE 4 circuit can operate as an amplitude discriminator similar to the FIGURE 2 circuit. If the impedance element 60 includes an element of inductance, gain is provided in the discrimination process. In particular, the impedance element 60 may take the form of a series resistor 84, inductor 86 combination, as illustrated in FIGURE 6. The other impedance element 72 may be a resistor (not shown).

Consider now the operation of the FIGURE 4 circuit in response to positive input pulses applied across the input terminals 36, 38. The quiescent operating state of the diode 34 is given by the point *e* of intersection of the load line 82 with the curve 42. The voltage across the diode 34 (and output terminals 76, 78) then is $V_1$ volts. The current supplied by the input pulses is taken up primarily by the diode 34 and load 40 since the inductor 86 acts to decouple the biasing circuit and supply a constant current to the junction point 90. The load line translates to the right in response to positive input pulses. The dashed load line 94 intersects the curve 42 at the peak of the characteristic and represents the load line in response to an input signal having a magnitude to increase the voltage across the diode from $E_1$ to $E_2$ volts. The load lines for signals having a lesser amplitude lie within the region between the lines 82 and 94. Very little increase in output voltage occurs in response to such signals.

If the amplitude of a positive input signal is greater than the aforementioned value, the diode 34 current exceeds the peak current corresponding to point *b*. The diode 34 is switched rapidly through its negative resistance region. Switching occurs along a substantially constant current line, such as the dashed line 96, because of the action of the inductor 86 tending to supply a constant current. The dashed line 96 intersects the curve 42 at a point *f*, corresponding to a large voltage $V_2$ across the diode 34. The line 96 may be thought of as a dynamic switching characteristic. The diode 34 has an inherent capacitance between its terminals. Current represented by the difference between the dynamic characteristic 96 and the portion *bcf* of curve 42 charges up this capacitance as the diode 34 is switched from the low voltage state to the high voltage state.

Gain arises from the fact that energy stored in the inductor 86 is delivered to the load when the diode 34 is switched. The current through the diode 34 then decreases from the point *f* toward the point *c* as the stored energy is given up by the inductor 86. Assuming that the input pulse is terminated by this time, the diode current decreases to a value corresponding to point *c* and, as the current falls below the valley current (point *c*), the diode 34 switches back rapidly through the negative resistance region. Switching may occur along a substantially constant-current line, such as the dashed line 100, to a point *g* of intersection with the curve 42 in the region *ab*. Operation of the diode then follows along the curve 42 from point *g* to the quiescent operating point *e*. The switching cycle time, or recovery time, of the diode is, in part, a function of the reactance.

It is thus seen that the circuit of FIGURE 4, as described, discriminates against, or compresses input signals having amplitudes below a certain threshold and expands signals having amplitudes greater than said threshold. This threshold may be adjusted by changing the value of the battery 70. The battery 70 voltage may be increased to a value such that the quiescent load line intersects the curve 42 in the positive resistance region *cd*. In this event, the circuit operates to discriminate against negative input signals having amplitudes below a certain threshold and to expand the negative signals which have amplitudes greater than said threshold. As in the FIGURE 2 circuit, however, better amplitude discrimination may be obtained for negative signals by reversing the battery 70 and the connections to the diode 34 in FIGURE 4.

The FIGURE 4 circuit may be used as an amplitude discriminator for pulsed carrier signals if the impedances are selected properly. A pulse carrier system may be defined as one in which a radio frequency (R.F.) carrier is modulated to provide bursts of higher amplitude R.F. signal. In one such system a D.C. pulse is applied to the nonlinear reactance element of a non-linear reactance modulator pumped at the carrier frequency. Such a system is described in an article by W. Eckhardt and F. Sterzer in the 1960 International Solid-State Computer Conference Digest of Technical Papers at page 34. When the circuit is used as an amplitude discriminator of pulsed carrier signals, the impedance elements 60 and 72 of FIGURE 4 should be tuned circuits or sections of transmission line.

One method of building a high speed digital computer is to use a pulsed microwave carrier, as suggested in the Eckhardt-Sterzer article aforementioned. The D.C. pulse applied to the modulator may represent a binary "one" and it is usually necessary to demodulate the pulsed carrier to recover the binary information in baseband pulse script. Using a variable capacity element in the modulator, a microwave carrier can be modulated with gain. Using a conventional diode as the demodulator or detector, however, the gain is largely lost due to the inefficiency of the diode detector in broad-band circuits. A tunnel diode, on the other hand, has a large possible gain-bandwidth product. Using a tunnel diode as the detector in a pulsed carrier system, gain can be achieved in the demodulation or detection process as well as in the modulation process.

Figure 7:
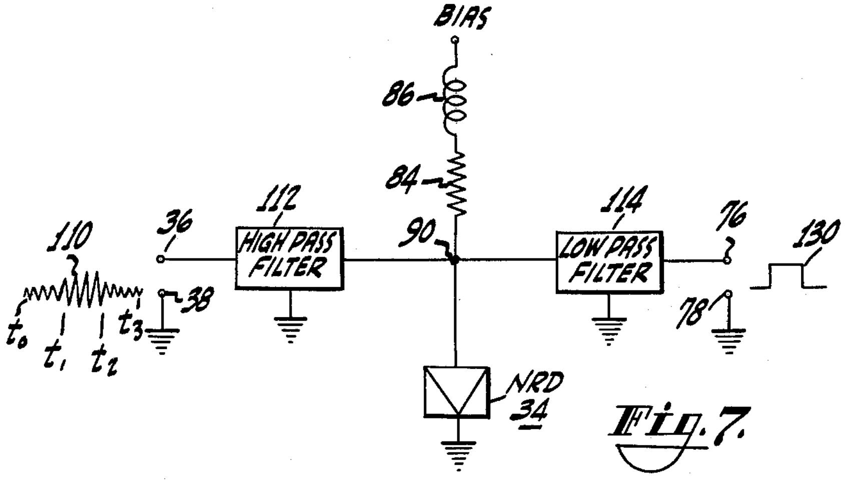
FIGURE 7 is a diagram of a monostable circuit which can provide demodulation of pulsed carrier signals.

A circuit according to the invention for demodulating pulsed carriers is illustrated in FIGURE 7. The circuit includes the series combination of a tunnel diode 34, a resistor 84 and an inductor 86 connected between ground and one terminal of a bias source. The bias source may be a battery having its positive terminal connected to the upper end of the inductor 86 and having its negative terminal grounded. In this event, the cathode of the diode 34 is connected to ground. The resistor 84 may represent the resistance of the inductor 86.

Pulsed carrier signals 110 to be demodulated are applied to the circuit at a pair of input terminals 36, 38. The terminal 38 is connected to ground and the terminal 36 is connected to the input of a high pass filter 112. The output of the high pass filter is connected to the junction point 90 at the anode of the diode 34. The junction point 90 also is connected to the input of a low pass filter 114, the output of which is connected to the ungrounded terminal 76 of a pair of output terminals 76, 78. A load (not shown) may be connected across the output terminals 76, 78.

Assume that the frequency of the input carrier signal 110 is $f$ and that the sidebands in the time period $T_1$ to $T_2$ are $f \pm f_1$. The high amplitude of the carrier during the period $T_1$ to $T_2$ is a result of applying a D.C. pulse to the modulator (not shown). It is desired to demodulate the carrier to recover this pulse, and to provide gain in the demodulation process. The high pass filter 112 may be an inductor-capacitor pi-type filter, the component values of which are chosen so that the filter 112 presents a very low impedance to the carrier frequency and the sidebands aforementioned, and presents a very high impedance to lower frequency signals. At the very high frequencies of interest in microwave computers, the filter 112 could be a strip transmission line filter of the type illustrated in the Proceedings of the IRE, August 1959, at page 1318, FIGURE 1. A band-pass filter also could be used. The low pass filter 114 may be an inductor-capacitor filter, the component values of which are selected so that the filter 114 presents a very high impedance to signals at the carrier $f$ and sideband $f \pm f_1$ frequencies and a very low impedance to lower frequencies.

Figure 8:
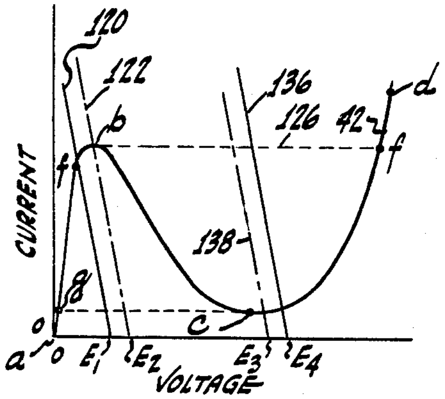
FIGURE 8 is a volt-ampere characteristic useful in explaining the FIGURE 7 circuit.

The FIGURE 7 circuit is biased for monostable operation in the same manner as the FIGURE 4 circuit. In particular, the quiescent load line may be the solid line 120 in FIGURE 8. The bias is adjusted so that the positive-going R.F. input signals in the time period $t_0$ to $t_1$ and $t_2$ to $t_3$ are of insufficient amplitude to trigger the tunnel diode 34. The dashed line 122 of FIGURE 8 may represent the load line in response to the positive input signals during the time periods aforementioned. As may be seen in FIGURE 8, the diode 34 current variation and voltage variation is relatively small in response to these signals. The negative-going signals also cause only a slight excursion, in the opposite sense, of the current and voltage.

The amplitude of the positive signals applied during the time period $t_1$ to $t_2$ is sufficient to increase the diode 34 current above the peak $b$ value. The diode 34 then switches rapidly through the negative resistance region. Switching occurs along a substantially constant-current line 126 to a point $f$ of relatively high voltage because of the action of the inductor 86. Power gain is provided at the expense of the energy given up by the inductor 86. The recovery time of the circuit is determined in part by the circuit reactance, which includes the inductance of the inductor 86. This recovery period may be made equal to the period $t_2 - t_1$.

The high pass filter 112 blocks the D.C. pulse developed across the diode 34 when it switches between the low and high states. The low pass filter 114 blocks the R.F. input signal from the output and also attenuates greatly any R.F. ripple in the pulse developed across the diode 34 during the period $t_1$ to $t_2$. A large amplitude D.C. pulse 130 appears across the output terminals 76, 78 in response to the signals applied at the input terminals 36, 38 during the period $t_1$ to $t_2$. A circuit of the type described provided an output of 40 milliwatts in response to an input signal of 1 milliwatt and a frequency of 4000 megacycles.

The quiescent bias for the FIGURE 7 circuit also may be adjusted to a value $E_4$ volts to provide a quiescent load line 136. Negative input signals during the time periods $t_0$ to $t_1$ and $t_2$ to $t_3$ then may cause the load line to shift to the position indicated by the line 138. Such signals are not of sufficient amplitude to trigger the diode 34. However, the negative-going signals during the period $t_1$ to $t_2$ are of sufficient amplitude to trigger the diode 34 into the negative resistance region, whereby a negative-going D.C. pulse of high amplitude is provided at the output terminals 76, 78. Gain is also achieved in this demodulation process.

What is claimed is:

1. A demodulator for pulsed carrier signals of the type wherein a carrier having a frequency $f$ and an amplitude X is modulated to provide signals having frequencies within the range $f \pm f_1$, and amplitude $Y>X$, the combination comprising: a voltage controlled diode having an N-type volt-ampere characteristic; an element of inductance serially connected with said diode; means connected in series with said diode and said element for biasing said diode monostably and providing a threshold Z, where $X<Z<Y$; a pair of input terminals for receiving said pulsed carrier signals; and a filter means connected between one of said terminals and said diode and tuned to provide a low impedance path to signals within the range of frequencies $f \pm f_1$.

2. The combination claimed in claim 1 and including: output means conected across said diode and including a filter tuned to provide a high impedance to signals having frequencies within the range $f \pm f_1$ and a low impedance to signals having a frequency less than $f - f_1$.

3. A demodulator for pulsed carrier signals of the type wherein a carrier having a frequency $f$ and an amplitude X is modulated to provide signals having frequencies within the range $f \pm f_1$, and amplitude $Y>X$ comprising: a diode having a volt-ampere characteristic defined by two regions of positive resistance separated by a region of negative resistance; an element of inductance; energizing means connected in series with said diode and said element for biasing said diode monostably and providing a threshold Z, where $X<Z<Y$; a pair of output terminals; filter means connected between one of said terminals and said diode and tuned to provide a relatively low impedance path to signals having a frequency less than $f - f_1$; and means for applying said carrier signals to said diode.

4. A demodulator for pulsed carrier signals of the type wherein a carrier of frequency $f$ and amplitude X is modulated during selected intervals of fixed duration during which the frequency of the signals is $f \pm f_1$ and the amplitude is $Y>X$, comprising: a monostable circuit including a diode having a volt-ampere characteristic defined by two regions of positive resistance separated by a region of negative resistance, an element of inductance, energizing means connected in series with said diode and said element of inductance for biasing said diode monostably and providing a triggering threshold Z, where $X<Z<Y$, said element having such a value of inductance that the recovery time of said monostable circuit is close to said fixed duration; means for applying said pulsed carrier signals to said diode; output means; and a filter connected between said diode and said output means and providing a relatively high impedance to frequencies within the range $f \pm f_1$ and a relatively low impedance to frequencies less than $f - f_1$.

5. A demodulator for pulsed carrier signals of the type wherein a carrier of frequency $f$ and amplitude X is modulated during selected intervals of fixed duration during which the frequency of the signals is $f \pm f_1$ and the amplitude is $Y>X$, comprising: a monostable circuit including a diode having a volt-ampere characteristic defined by two regions of positive resistance separated by a region of negative resistance, an element of inductance, energizing means connected in series with said diode and said element of inductance for biasing said diode monostably and providing a triggering threshold Z, where $X<Z<Y$, said element having such a value of inductance that the recovery time of said monostable circuit is close to said fixed duration; a pair of input terminals for receiving said pulsed carrier signals; filter means connected between one of said terminals and said diode and tuned to provide a relatively low impedance path to signals within the range of frequencies $f \pm f_1$; and output means connected across said diode.

6. A demodulator for pulsed carrier signals of the type wherein a carrier of frequency $f$ and amplitude X is modulated during selected intervals of fixed duration during which the frequency of the signals is $f \pm f_1$ and the amplitude is $Y > X$, comprising: a monostable circuit including a diode having a volt-ampere characteristic defined by two regions of positive resistance separated by a region of negative resistance, an element of inductance, energizing means connected in series with said diode and said element of inductance for biasing said diode monostably and providing a triggering threshold Z, where $X < Z < Y$, said element having such a value of inductance that the recovery time of said monostable circuit is close to said fixed duration; a pair of input terminals for receiving said carrier signals; first filter means connected between one of said input terminals and said diode and tuned to provide a relatively low impedance path to signals within the range of frequencies $f \pm f_1$; output means; and a second filter means connected between said diode and said output means and providing a relatively high impedance to frequencies within the range $f \pm f_1$ and a relatively low impedance to frequencies less than $f - f_1$.

References Cited in the file of this patent

UNITED STATES PATENTS

| | | |
|---|---|---|
| 2,958,046 | Watters | Oct. 25, 1960 |
| 2,966,599 | Haas | Dec. 27, 1960 |

OTHER REFERENCES

Electrical Manufacturing, "The Esaki Tunnel Diode," reprint from February, 1960 issue.

Electrical Communication, June 1955, pages 112–117. "Germanium Positive-Gap Diodes," Reeves et al. (Library Ref.: TK1.E26).